United States Patent [19]

Wittmer

[11] Patent Number: 4,717,693
[45] Date of Patent: Jan. 5, 1988

[54] PROCESS FOR PRODUCING BETA SILICON NITRIDE FIBERS

[75] Inventor: Dale E. Wittmer, Carbondale, Ill.

[73] Assignee: GTE Products Corporation, Stamford, Conn.

[21] Appl. No.: 922,650

[22] Filed: Oct. 24, 1986

[51] Int. Cl.$^4$ ............... C04B 35/58; C01B 21/068
[52] U.S. Cl. .................................. 501/97; 501/92; 501/95; 501/96; 423/344
[58] Field of Search ............... 501/97, 92, 95, 96; 423/344

[56] References Cited

U.S. PATENT DOCUMENTS

| | | | |
|---|---|---|---|
| 3,394,991 | 7/1968 | Evans | 423/344 |
| 3,413,090 | 11/1968 | Krock et al. | 423/344 |
| 3,677,713 | 7/1972 | Evans | 501/97 |

Primary Examiner—William R. Dixon, Jr.
Assistant Examiner—Anthony J. Green
Attorney, Agent, or Firm—Donald R. Castle; L. Rita Quatrini

[57] ABSTRACT

A process is disclosed for producing beta silicon nitride fibers. The process involves heating a green article of a silicon nitride based material in a furnace at a temperature of from about 1700° C. to about 2000° C. at a pressure of nitrogen gas of at least about 100 psig for a sufficient time to form silicon nitride fibers, the major portion of which are beta silicon nitride fibers. The heating step is carried out with the article covered with a cover made of silicon carbide or silicon nitride. Alternately, the article can be in a container of silicon nitride or silicon carbide and covered with the cover.

12 Claims, No Drawings

PROCESS FOR PRODUCING BETA SILICON NITRIDE FIBERS

This invention relates to a method for producing silicon nitride fibers the major portion of which are beta silicon nitride fibers. More particularly essentially all of the fibers are beta siicon nitride fibers.

BACKGROUND OF THE INVENTION

Up to this time, there has been no commercially available silicon nitride fibers or whiskers which are essentially all beta silicon nitride whiskers. Since the beta silicon nitride phase is the high temperature stable phase for silicon nitride, it is the desired phase for use in ceramics, ceramic composites or as fibrous material for use as a thermal barrier coating or tile. A technique described by NASA's Jet Propulsion Laboratory, Pasadena, Calif. produces beta silicon nitride whiskers about 1 micrometer in diameter and up to about 5 centimeters long over a cork like mass of submicron beta sialon whiskers. The disadvantages of this method are that (1) sialon whiskers are the major phase present and are not as stable as pure beta silicon nitride whiskers at high temperatures, (2) whiskers are formed on the inside of a tube made of firebrick only 1" in diameter which suggests that it may be only a laboratory process, (3) a silica/carbon coating is painted on the inside of a tube of firebrick and, therefore, it would be difficult to control the final reactant concentrations, and (4) upscale of this process has not been demonstrated.

SUMMARY OF THE INVENTION

In accordance with one aspect of this invention, there is provided a process for producing beta silicon nitride fibers. The process involves heating a green article of a silicon nitride based material in a furnace at a temperature of from about 1700° C. to about 2000° C. at a pressure of nitrogen gas of at least about 100 psig for a sufficient time to form silicon nitride fibers, the major portion of which are beta silicon nitride fibers. The heating step is carried out with the article covered with a cover made of silicon carbide or silicon nitride. Alternately, the article can be in a container of silicon nitride or silicon carbide and covered with the above described cover.

DETAILED DESCRIPTION OF THE INVENTION

For a better understanding of the present invention, together with other and further objects, advantages and capabilities thereof, reference is made to the following disclosure and appended claims in connection with the above description of some of the aspects of the invention.

This invention relates to a process for producing beta silicon nitride fibers. The preferred substrate is silicon carbide or silicon nitride instead of firebrick so that essentially only beta silicon nitride fibers or whiskers are formed.

A silicon nitride based green article is the starting material of the process of this invention. The silicon nitride based material is typically, but not limited to silicon nitride with additives such as aluminum oxide and yttrium oxide.

The silicon nitride of the green article is preferably a very pure alpha silicon nitride. One such preferred source of silicon nitride is supplied by the Chemical and Metallurgical Division of GTE Products Corporation under the name of SN 502. The silicon nitride powder is preferably first milled with water and then slip cast into the article. The article is then dried and is now ready for use as the starting material in the process of this invention.

The green silicon nitride article is introduced into a furnace which is preferably capable of at least about 1900° C. and at least about 200 psig of nitrogen gas. The article is covered with a cover made of a material which can be silicon carbide or silicon nitride. The preferred source of the silicon carbide is supplied by Norton under the trade name of CRYSTAR. The covers are preferably inverted crucibles. Alternately, the article can be placed in a container such as a crucible made of silicon carbide or silicon nitride and covered with the above described type of cover.

The green article is heated in a furnace, covered as described above, at a temperature of from about 1700° C. to about 2000° C. at a pressure of nitrogen gas of at least about 100 psig for a sufficient time to form silicon nitride fibers, the major portion of which are beta siilcon nitride fibers. Most typically essentially all of the silicon nitride fibers are beta silicon nitride fibers. Preferred temperatures are from about 1825° C. to about 1925° C. with about 1880° C. being especially preferred. The preferred pressures of nitrogen gas are are from about 100 psig to about 400 psig with from about 200 psig to about 250 psig being especially preferred. The time at temperature is dependent on the design of the furnace, and how much conversion to fibers is desired. The longer the heating time, the more of the starting silicon nitride is converted to fibers.

In accordance with a preferred but not a limiting embodiment, the article is heated in the furnace according to the following schedule. It is to be understood that the specific heating schedule employed will depend on factors as the design of the furnace, the amount of material, etc., without departing from the scope of the invention.

The temperature of the furnace is increased to about 1000° C. at a heating rate of about 60° C. per minute at a pressure of about 0.1 torr which is essentially vacuum. The temperature is maintained at about 1000° C. while the pressure is increased to about 20 psig of nitrogen gas in about 15 minutes. The temperature is then increased to about 1400° C. in about 30 minutes at the 20 psig nitrogen pressure. The temperature is maintained at about 1400° C. and the pressure is maintained at the 20 psig level for about 60 minutes. After this time, the temperature is increased to about 1880° C. in about 30 minutes while the pressure is increased to about 200 psig of nitrogen at a rate of about 5 psig per minute. The temperature is maintained at about 1880° C. and the pressure is maintained at about 200 psig of nitrogen for from about 2 hours to about 6 hours. During the high temperature hold, the silicon nitride fibers grow.

Following the heating schedule, the resulting heated silicon nitride is cooled typically at a rate of about 10° C. per minute while the pressure is maintained at the given pressure of nitrogen.

The size of the fibers depends on factors as the size of the silicon nitride article and the size of the cover. This will be apparent in the examples that follow.

To more fully illustrate this invention, the following nonlimiting examples are presented.

EXAMPLE 1

Large slip cast silicon nitride article or preform with close fitting CRYSTAR cover.

The preform is heated and cooled according to the heating schedule described previously. The result is a light fluffy blanket of fibers about 100% of which are beta silicon nitride of from about 0.2 to about 1 micrometer in diameter and up to several centimeters in length. The blanket thickness is about from about 3 to about to 4 centimeters.

EXAMPLE 2

Small slip cast silicon nitride article or preform with large CRYSTAR cover.

The preform is heated according to the heating and cooling schedule described previously. The result is coarse flat whiskers of beta silicon nitride with a light greenish tint suggestive of microfine silicon carbide but not as fine as the fibers produced in Example 1.

EXAMPLE 3

Large slip cast silicon nitride preform with close fitting graphite cover for purposes of comparison with Examples 1 and 2.

A silicon nitride preform is heated and cooled according to the schedule described previously. The result is that the external surface of the silicon nitride preform is covered with silicon carbide "fuzz" and the exterior of the crucible appears to be converted to a very thin layer of polycrystalline silicon carbide. The inside of the graphite cover is coated with a green silicon carbide coating and light silicon carbide "fuzz". No beta silicon carbide is detected in the "fuzz". This shows that the nature of the cover material affects the nature of the product and that graphite covers do not work in the process of this invention.

While there has been shown and described what are at present considered the preferred embodiments of the invention, it will be obvious to those skilled in the art that various changes and modifications may be made therein without departing from the scope of the invention as defined by the appended claims.

What is claimed is:

1. A process for producing beta silicon nitride fibers, said process comprising:
   (a) heating a silicon nitride green article in a furnace, said article being covered with a cover made of material selected from the group consisting of silicon carbide and silicon nitride, said heating being carried out at a temperature of from about 1700° C. to about 2000° C. at a pressure of at least about 100 psig of nitrogen gas and
   (b) vapor depositing silicon nitride fibers, the major portion of which are beta silicon nitride fibers on the silicon nitride or silicon carbide.

2. A process of claim 1 wherein the temperature is from about 1825° C. to about 1925° C.

3. A process of claim 2 wherein the temperature is about 1880° C.

4. A process of claim 1 wherein the pressure of nitrogen gas is from about 100 psig to about 400 psig.

5. A process of claim 4 wherein the pressure of nitrogen gas is from about 200 psig to about 250 psig.

6. A process of claim 1 wherein essentially all of said fibers are beta silicon nitride fibers.

7. A process for producing beta silicon nitride fibers, said process comprising:
   (a) heating a silicon nitride green article in a furnace, said article being in a container made of a material selected from the group consisting of silicon carbide and silicon nitride, said container being covered with a cover made of material selected from the group consisting of silicon carbide and silicon nitride, said heating being carried out at a temperature of from about 1700° C. to about 2000° C. at a pressure of from at least about 100 psig of nitrogen gas and
   (b) vapor depositing silicon nitride fibers, the major portion of which are beta silicon nitride fibers on the silicon nitride or silicon carbide.

8. A process of claim 7 wherein the temperature is from about 1825° C. to about 1925° C.

9. A process of claim 8 wherein the temperature is about 1880° C.

10. A process of claim 7 wherein the pressure of nitrogen gas is from about 100 psig to about 400 psig.

11. A process of claim 10 wherein the pressure of nitrogen gas is from about 200 psig to about 250 psig.

12. A process of claim 7 wherein essentially all of said fibers are beta silicon nitride fibers.

* * * * *